United States Patent [19]
Chen et al.

[11] Patent Number: 5,825,230
[45] Date of Patent: Oct. 20, 1998

[54] AMPLIFIER-LESS LOW POWER SWITCHED-CAPACITOR TECHNIQUES

[75] Inventors: Feng Chen; Bosco Leung, both of Waterloo, Canada

[73] Assignee: University of Waterloo, Waterloo, Canada

[21] Appl. No.: 916,530

[22] Filed: Aug. 22, 1997

Related U.S. Application Data

[63] Continuation of Ser. No. 593,126, Feb. 1, 1996, abandoned.

[51] Int. Cl.⁶ .................................................. G06G 7/64
[52] U.S. Cl. ......................... 327/337; 327/554; 327/558
[58] Field of Search ............................. 307/110; 327/536, 327/537, 551, 552, 554, 558, 336, 337

[56] References Cited

U.S. PATENT DOCUMENTS

| | | | |
|---|---|---|---|
| 5,095,223 | 3/1992 | Thomas | 307/110 |
| 5,132,895 | 7/1992 | Kase | 363/60 |
| 5,481,447 | 1/1996 | Caris et al. | 327/536 |
| 5,491,623 | 2/1996 | Jansen | 327/536 |

*Primary Examiner*—Timothy P. Callahan
*Assistant Examiner*—Jeffrey Zweizig
*Attorney, Agent, or Firm*—Foley & Lardner

[57] ABSTRACT

A switched-capacitor gain-boost network includes a bank of N-substantially identical sampling capacitors connectable to an output node. An integrating capacitor has one node connected to a low potential node and a second node connected to the output node. The integrating capacitor is connected to the bank of sampling capacitors in parallel when the bank of sampling capacitors is connected to the output node. Sampling period switches are actuable during a sampling period to connect the sampling capacitors of the bank in parallel and to connect the bank between an analog signal input node and a low potential node to charge the sampling capacitors. Integrating period switches are actuable during an integrating period to connect the sampling capacitors of the bank in series and to connect the bank between a low potential node and the output node to dump the charge stored by the sampling capacitors onto the integrating capacitor. A method of providing dc gain to an analog input signal is also provided.

14 Claims, 14 Drawing Sheets

THE EQUIVALENT CAPACITANCE OF THE NETWORK IN SERIES CONNECTION

WHERE:
$C_{rx}$ = PARASITIC CAPACITANCE ASSOCIATED WITH TOP PLATE OF EQUIVALENT CAPACITANCE.

$C_{rb}$ = PARASITIC CAPACITANCE ASSOCIATED WITH BOTTOM PLATE OF EQUIVALENT CAPACITANCE.

THE DC GAIN OF THE NETWORK VERSUS TOTAL CAPACITIVE PARASITICS WITH N=4

THE DC GAIN $A_{in\_t}$ OF THE NETWORK VERSUS THE NUMBER OF CAPS.

THE DC GAIN $A_{in\_b}$ OF THE NETWORK VERSUS THE NUMBER OF CAPS.

THE RATIO $A_{in\_t} / A_{in\_b}$ VERSUS THE NUMBER OF CAPS

THE DC GAIN $A_{in\_t}$ VERSUS THE NUMBER OF CAPS WITH 5V SUPPLY AT 10 MHz

THE DC GAIN $A_{in\_b}$ VERSUS THE NUMBER OF CAPS WITH 5V SUPPLY AT 10 MHz

THE DC GAIN $A_{in\_t}$ VERSUS THE NUMBER OF CAPS WITH DIFFERENT SUPPLY

THE DC GAIN $A_{in\_t}$ VERSUS CLOCK RATE WITH DIFFERENT NUMBER OF CAPS

MEASURED SPECTRUM OF IDLE CHANNEL NOISE 5,825,230

AMPLIFIER-LESS LOW POWER SWITCHED-CAPACITOR TECHNIQUES

This is a continuation of application Ser. No. 08/593,126 filed Feb. 1, 1996, now abandoned.

FIELD OF THE INVENTION

The present invention relates to lowpass filters and in particular to an amplifier-less low power switched-capacitor gain-boost network and method of providing dc gain to an analog input signal.

BACKGROUND OF THE INVENTION

Lowpass filters whether of the passive or active type are well known in the art. Lowpass filters of the passive type may be in the form of a resistor-capacitor (RC) network or a switched-capacitor (SC) network. Lowpass filters of the active type incorporate an open-loop operational amplifier. Conventional passive lowpass filters consume little power but have unity dc gain regardless of the size of the capacitors used in the network. On the other hand, active lowpass filters provide for dc gain but consume significant amounts of power and have speed limitations. In many applications, lowpass filters are desired which provide for dc gain but which reduce power consumption while maintaining high speed operation.

It is therefore an object of the present invention to provide a novel switched-capacitor gain-boost network, switched-capacitor lowpass filter and method of providing dc gain to an analog input signal.

SUMMARY OF THE INVENTION

According to one aspect of the present invention there is provided a switched-capacitor gain-boost network comprising:

a plurality of N-sampling charge storing devices having substantially similar charge storing characteristics, said plurality of sampling charge storing devices being connectable to an output node;

an integrating charge storing device connected to said output node and connectable to said plurality of sampling charge storing devices in parallel; and switch means actuable during a sampling period to connect each of said sampling charge storing devices in parallel and between an analog signal input node and a low potential node and actuable during an integrating period to connect each of said sampling charge storing devices in series and between a low potential node and said output node.

According to yet another aspect of the present invention there is provided a switched-capacitor lowpass filter comprising:

a bank of N-substantially identical sampling capacitors connectable to an output node;

an integrating capacitor connected between said output node and a low potential node, said integrating capacitor being connectable in parallel with said bank of sampling capacitors;

first switch means actuable during a sampling period to connect the sampling capacitors of said bank in parallel and to connect said bank between an analog signal input node and a low potential node to charge each of said sampling capacitors to a voltage substantially equal to the voltage applied to said analog signal input node; and second switch means actuable during an integrating period to connect the sampling capacitors of said bank in series and to connect said bank between a low potential node and said output node.

In one embodiment, the first switch means connects the sampling capacitors to the analog signal input node in a manner such that the switched-capacitor lowpass filter generates inverted output. In this configuration, it is preferred that the first switch means is actuated during the sampling period to inhibit injection charge error from being applied to the integrating capacitor by the bank of sampling capacitors during the integrating period. It is also preferred that the second switch means is actuated during the integrating period to inhibit voltage add-up from occurring across the sampling capacitors and to inhibit charge errors generated by the second switch means from being applied to the integrating capacitor.

In another embodiment, the first switch means connects the sampling capacitors to the analog signal input node in a manner such that the switched-capacitor lowpass filter generates non-inverted output. In this embodiment, it is preferred that the second switch means is actuated during the integrating period to inhibit voltage add-up from occurring across the sampling capacitors and to inhibit charge errors generated by the second switch means from being applied to the integrating capacitor.

According to still yet another aspect of the present invention there is provided a method of providing dc gain to an analog input signal comprising the steps of:

during a sampling period, (i) connecting a plurality of N-substantially identical sampling capacitors in parallel and charging each of said sampling capacitors by applying said analog input signal thereto; and during an integrating period (ii) isolating said sampling capacitors from said analog input signal; (iii) connecting said sampling capacitors in series; and (iv) connecting the sampling capacitors to an output node and in parallel with an integrating capacitor.

The present invention provides advantages in that dc gain for a lowpass function can be achieved without the need for active components. This design overcomes the speed limitation and power consumption problems associated with active lowpass filters incorporating operational amplifiers.

BRIEF DESCRIPTION OF THE DRAWINGS

Embodiments of the present invention will now be described more fully with reference to the accompanying drawings in which:

FIG. 1b is a timing diagram for the switched-capacitor gain-boost network of FIG. 1a;

FIG. 3b is a timing diagram for the switched-capacitor gain-boost network of FIG. 3a;

DESCRIPTION OF THE PREFERRED EMBODIMENTS

Figure 1A:
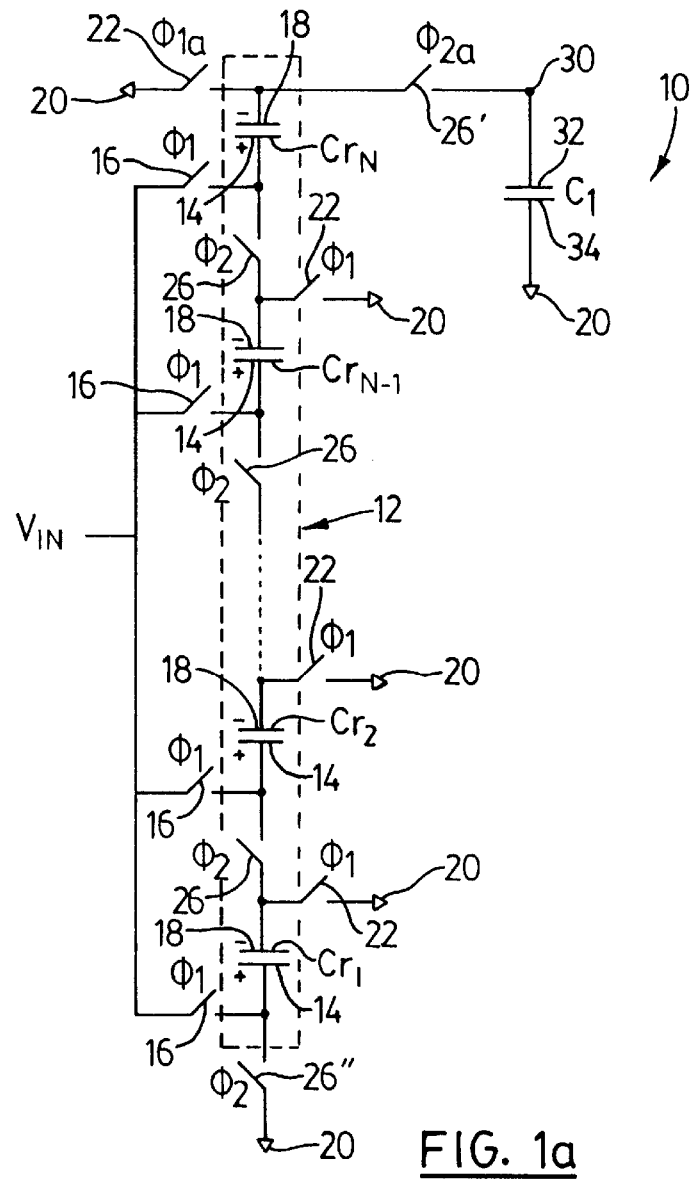
FIG. 1a is a schematic of an inverting switched-capacitor gain-boost network in accordance with the present invention.

Referring now to FIG. 1a, an inverting switched-capacitor gain-boost network is shown and is generally indicated to by reference numeral 10. The switched-capacitor gain-boost network 10 provides dc gain for a lowpass function without the need for active components. Because the switched-capacitor gain-boost network 10 is passive, it consumes very little power and overcomes the speed limitation problems associated with lowpass filters incorporating operational amplifiers (op-amps).

As can be seen, the switched-capacitor gain-boost network 10 includes a bank 12 of N-sampling capacitors $Cr_x$. It is preferred that the sampling capacitors $Cr_x$ are basically identical. The bottom plates 14 of the sampling capacitors $Cr_x$ are connectable to an analog signal input node Vin by way of switches 16. The top plates 18 of the sampling capacitors $Cr_x$ are connected to a low potential node, in this case ground 20, by way of switches 22. The switches 16 and 22 constitute a set of sampling period switches and when actuated connect the sampling capacitors $Cr_x$ in the bank 12 in parallel. The sampling period switches 22 also connect the bank 12 of sampling capacitors $Cr_x$ between the analog signal input node Vin and ground 20.

In addition to the switches 16 and 22, the switched-capacitor gain-boost network 10 includes a set of integrating period switches 26. With the exception of the integrating period switches 26' and 26" at the top and bottom of the bank 12 respectively, the integrating period switches 26 are interposed between a respective pair of sampling capacitors $Cr_x$ in the bank 12 and when actuated, connect the sampling capacitors $Cr_x$ in the bank 12 in series. The integrating period switch 26" at the bottom of the bank 12 connects the bottom plate 14 of sampling capacitor $Cr_1$ to ground 20 while the integrating period switch 26' at the top of the bank 12, connects the top plate 18 of the sampling capacitor $Cr_N$ to an output node 30 and to the top plate 32 of an integrating capacitor Ci. The bottom plate 34 of the integrating capacitor Ci is connected to ground 20.

Figure 1B:
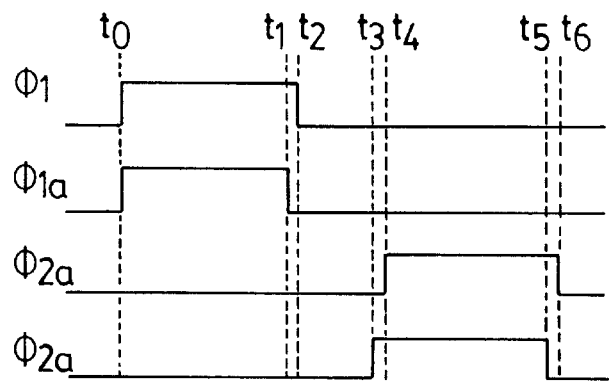

Control clocks $Ø_1$, $Ø_{1a}$, $Ø_2$ and $Ø_{2a}$ (see FIG. 1b) provide clock pulses to control the timing of the switched-capacitor gain-boost network 10 and actuation of the switches 16, 22 and 26 respectively. The control clock $Ø_1$ providing clock pulses to switches 16 and 22 has a sharp falling edge so that channel charges are split evenly between the source and drain nodes of the switches 16 and 22 when the switches are opened.

The switched-capacitor gain-boost network 10 uses a novel charge sampling/dumping scheme to introduce dc gain to an analog input signal applied to analog input signal node Vin. This is achieved by sampling the analog input signal applied to analog signal input node Vin onto the N-sampling capacitors $Cr_x$ while they are connected in parallel and thereafter, reconfiguring the connections between the sampling capacitors $Cr_x$ to connect them in series and dumping the signal charge stored by the sampling capacitors $Cr_x$ onto the integrating capacitor Ci.

Further details of the operation of the switched-capacitor gain-boost network 10 will now be described more fully with reference to FIGS. 1a to 2d. With the above described sampling/dumping scheme, the switched-capacitor gain-boost network 10 ideally has a transfer function Hsc as follows:

$$Hsc = Vo(z)/Vin(z) = -\frac{z^{-1}Cr/(Cr/N + Ci)}{1 - Ci/(Cr/N + Ci)z^{-1}} \quad (1)$$

where:
Cr is the sampling capacitance of the switched-capacitor gain-boost network 10 during the sampling period; and
Ci is the integrating capacitance.

As will be apparent, the transfer function Hsc has a dc gain of N where N is equal to the total number of sampling capacitors $Cr_x$ in the bank 12. The pole position of the switched-capacitor gain-boost network 10 is determined by the term Ci(Cr/N+Ci). The switched-capacitor gain-boost network will provide a frequency response the same as a switched-capacitor gain-boost network having only a single sampling capacitor when Cr is equal to the capacitance of that single sampling capacitor.

During the sampling period at time to, clock pulses are applied to each of the switches 16 and 22 by control clocks $Ø_1$ and $Ø_{1a}$ to condition them to a closed condition. With the switches 16 and 22 closed, the sampling capacitors $Cr_x$ of the bank 12 are connected in parallel and the bank 12 is connected between the analog signal input node Vin and ground 20 so that the sampling capacitors $Cr_x$ charge to the level of the analog input signal applied to the analog signal input node Vin (see FIG. 2a).

Figure 2A:
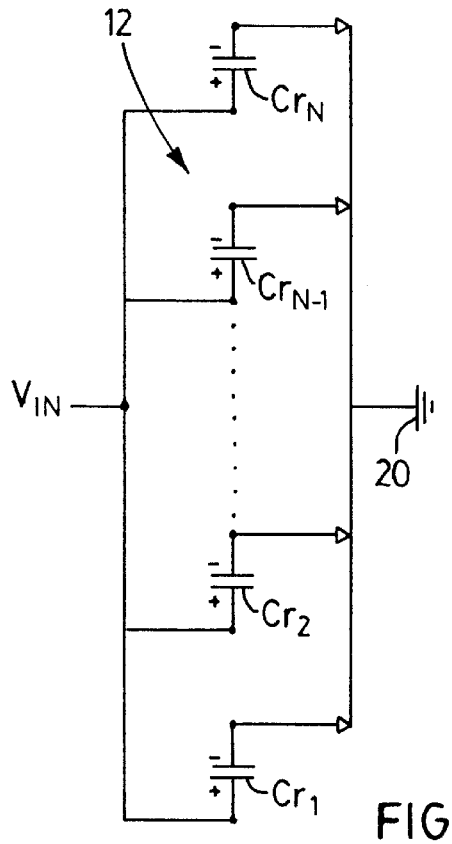
FIGS. 2a to 2d show equivalent circuits of the switched-capacitor gain-boost network of FIG. 1a during various stages of its operation.
Figure 2B:
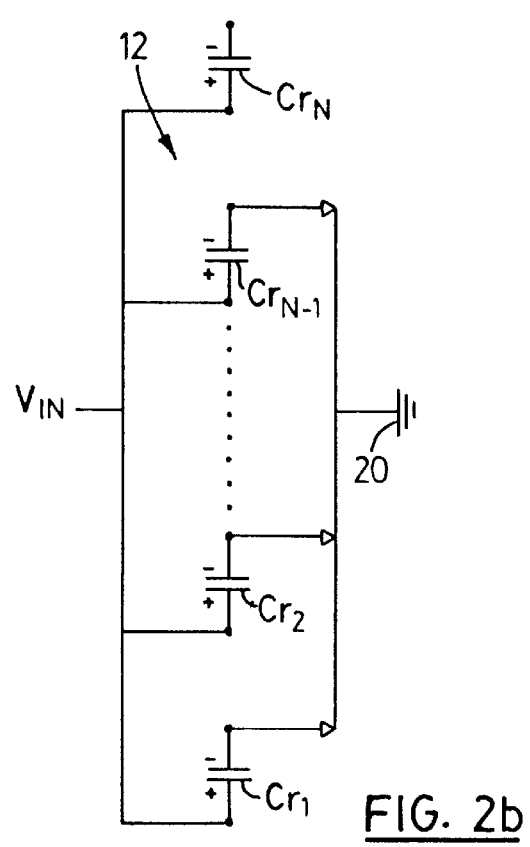

At time $t_1$, the switch 16 connecting the top plate 18 of sampling capacitor $Cr_N$ is opened by control clock $Ø_{1a}$ (see FIG. 2b). Shortly thereafter at time $t_2$, the remainder of the switches 16 and 22 are opened by control clock $Ø_1$ to complete the sampling period and return the switched-capacitor gain-boost network 10 to the condition shown in FIG. 1a with the exception that the sampling capacitors $Cr_x$ now store a charge. This timing of the switches 16 and 22 is adopted to minimize signal-dependent charge injection error as will be described.

Since the control clock $Ø_1$ has a sharp falling edge, channel charge is split evenly between the drain and source nodes of the switches 16 and 22 when the switches are opened at time $t_2$. If the switch components in the switched-capacitor gain-boost network 10 are equal, an equal amount of charge from each switch 16 and 22 will be dumped onto the corresponding sampling capacitor plates 14 and 18 respectively. Because the switch 16 connecting the top plate 18 of sampling capacitor $Cr_N$ is opened before the other switches 16 and 22, error charge is only dumped onto the bottom plate 14 of the sampling capacitor $Cr_N$ by the switch 16 connected to the bottom plate 14 of that sampling capacitor. The polarity of the error charges dumped onto the plates of the sampling capacitors $Cr_x$ by the switches 16 and 22 are shown in FIG. 1a and will cancel out for first-order approximation during the integrating period when the switches 16 and 22 are opened and switches 26 are closed.

Figure 2C:
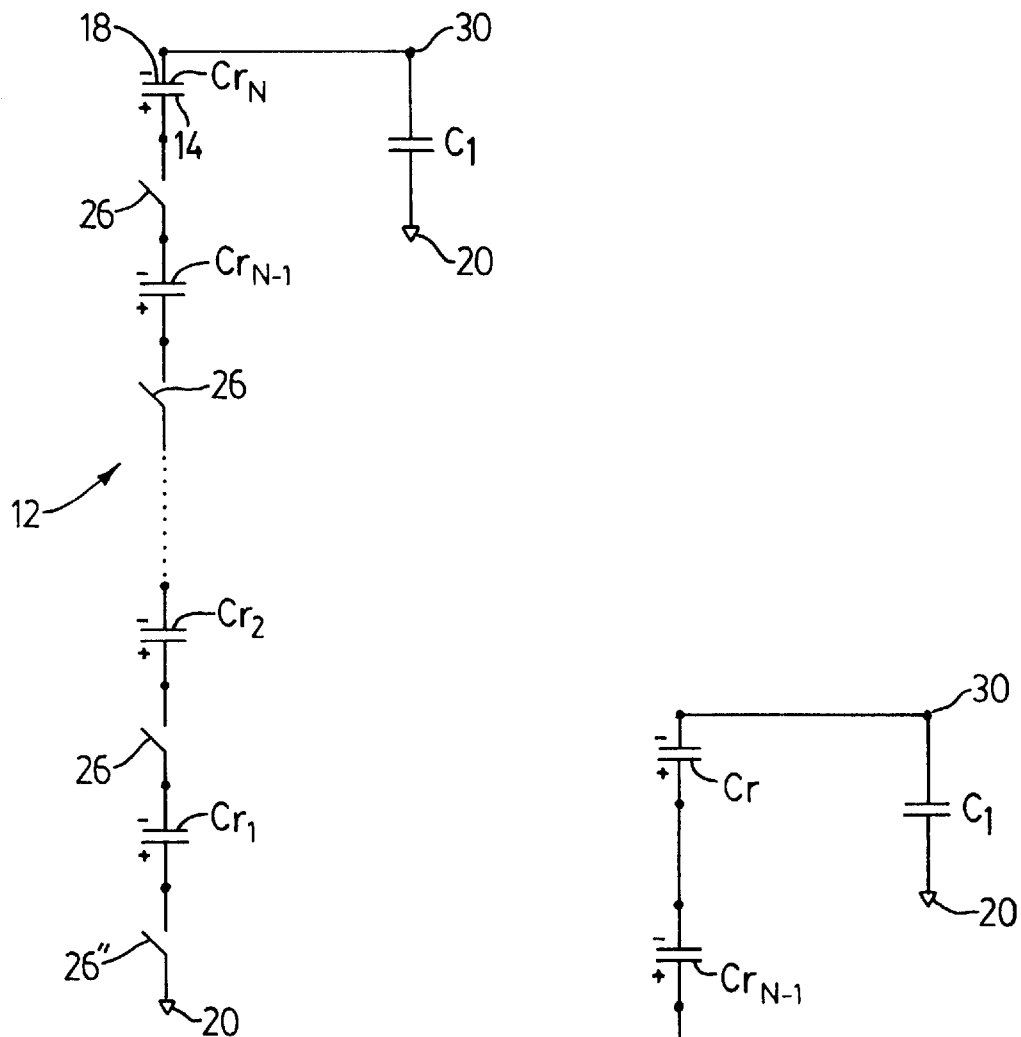
Figure 2D:
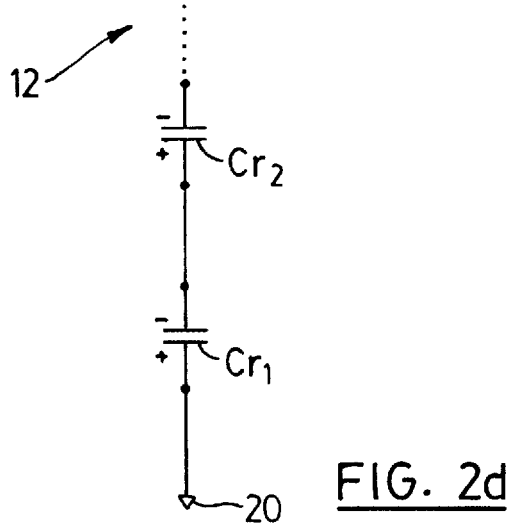

During the integrating period at time $t_3$, the switch 26' connecting the top plate 18 of the sampling capacitor $Cr_N$ to the output node 30 and to the top plate 32 of the integrating capacitor Ci is closed by control clock $Ø_{2a}$ (see FIG. 2c). Shortly, thereafter at time $t_4$, the remainder of the switches 26 and 26" are closed by control clock $Ø_2$ (see FIG. 2d). This timing of the switches 26 is adopted to avoid voltage add-up across the series connected sampling capacitors $Cr_x$. Specifically, with the switch 26' closed prior to the switches 26 and 26", when the switches 26 and 26" are closed a large transient current in the bank 12 is established instantly which in turn causes enough of a voltage drop across each switch 26 to avoid voltage add-up while the transient current discharges each sampling capacitor $Cr_x$.

With the switches 26, 26' and 26" closed, the charge on the sampling capacitors $Cr_x$ is dumped onto the integrating capacitor Ci. At time $t_5$, the control clock $\emptyset_{2a}$ opens the switch 26' and shortly after that at time $t_6$, the control clock $\emptyset_2$ opens the remaining switches 26 and 26". The switch 26' is opened slightly before the remaining switches 26 and 26" so that charge errors generated by the switches 26 are not dumped onto the integrating capacitor Ci.

As will be appreciated, the switched-capacitor gain-boost network 10 provides dc gain to the analog input signal sampled by the sampling capacitors $Cr_x$ after the sampling capacitors are connected in series and their stored charge is dumped onto the integrating capacitor Ci. In an ideal situation, the dc gain will be equal to N, the number of sampling capacitors $Cr_x$ in the switched-capacitor gain-boost network 10.

Figure 3A:
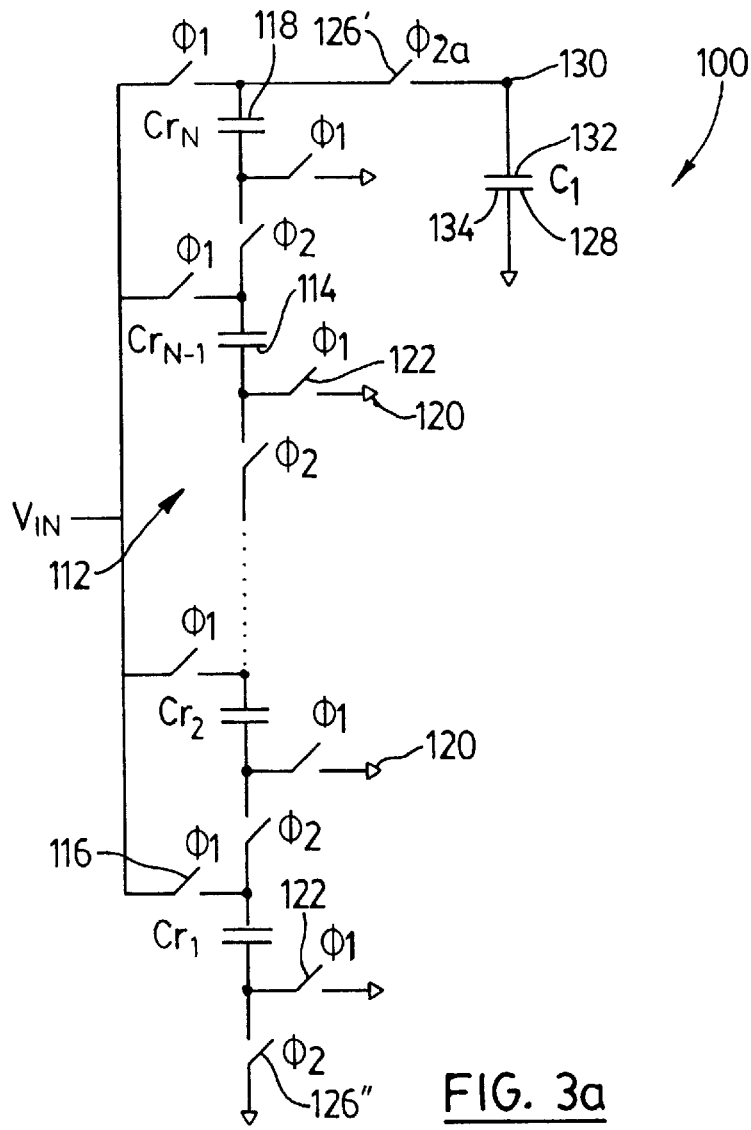
FIG. 3a is a schematic of a non-inverting switched-capacitor gain-boost network in accordance with the present invention.
Figure 3B:
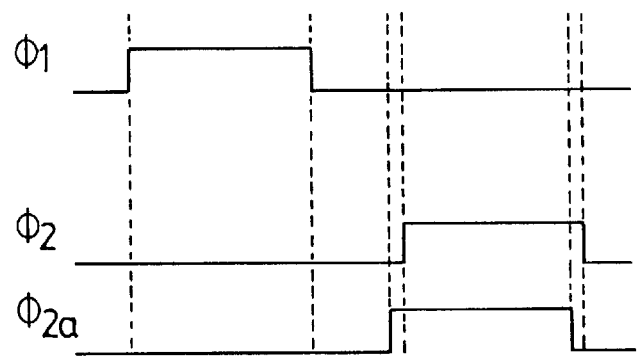

Referring now to FIGS. 3a and 3b, an alternative embodiment of a non-inverting switched-capacitor gain-boost network is shown and is generally indicated to by reference numeral 100. The switched-capacitor gain-boost network 100 is very similar to that of the previous embodiment except that the switches 116 connect the top plate 118 of each sampling capacitor $Cr_x$ to the analog signal input node Vin in response to the control clock $\emptyset_1$ while the switches 122 connect the bottom plate 114 of each sampling capacitor $Cr_x$ to ground 120 in response to the control clock $\emptyset_1$ during the sampling period. This results in a non-inverted charge being dumped onto the integrating capacitor Ci during the integrating period when the switches 116 and 122 are opened and the switches 126 are closed.

Because the top plate 118 of the top sampling capacitor $Cr_N$ in the bank 112 is connected to the analog signal input node Vin during the sampling period, charge injection error applied to the integrating capacitor by the sampling capacitor $Cr_N$ cannot be inhibited using a timing scheme as is achieved in the switched-capacitor gain-boost network 10 described previously. Thus, all of the switches 116 and 122 can be controlled by a single control clock $\emptyset_1$. However, it is desired to control the switches 126 in the same manner as described with reference to the previous embodiment to avoid voltage add-up error. The ideal transfer function Hsc of the switched-capacitor gain-boost network 100 is the same as that of equation 1 except the polarity is reversed.

The switched-capacitor gain-boost networks 10 and 100 are particularly useful to introduce dc conversion gain in a MOS passive switch mixer for wireless communications systems. This is due to fact that the switched-capacitor gain-boost networks do not introduce significant time delay and consume very little power. Details on such passive mixers can be found in the following articles: P. Y. Chan "A Highly Linear 1-GHz CMOS Down-Conversion Mixer", Technical Digest of European Solid State Circuits Conference, September 1993; and Cynthia Diane Keys, "Low-Distortion Mixers for RF Communications", Ph.D thesis, UC Berkeley, 1994.

Figure 5:
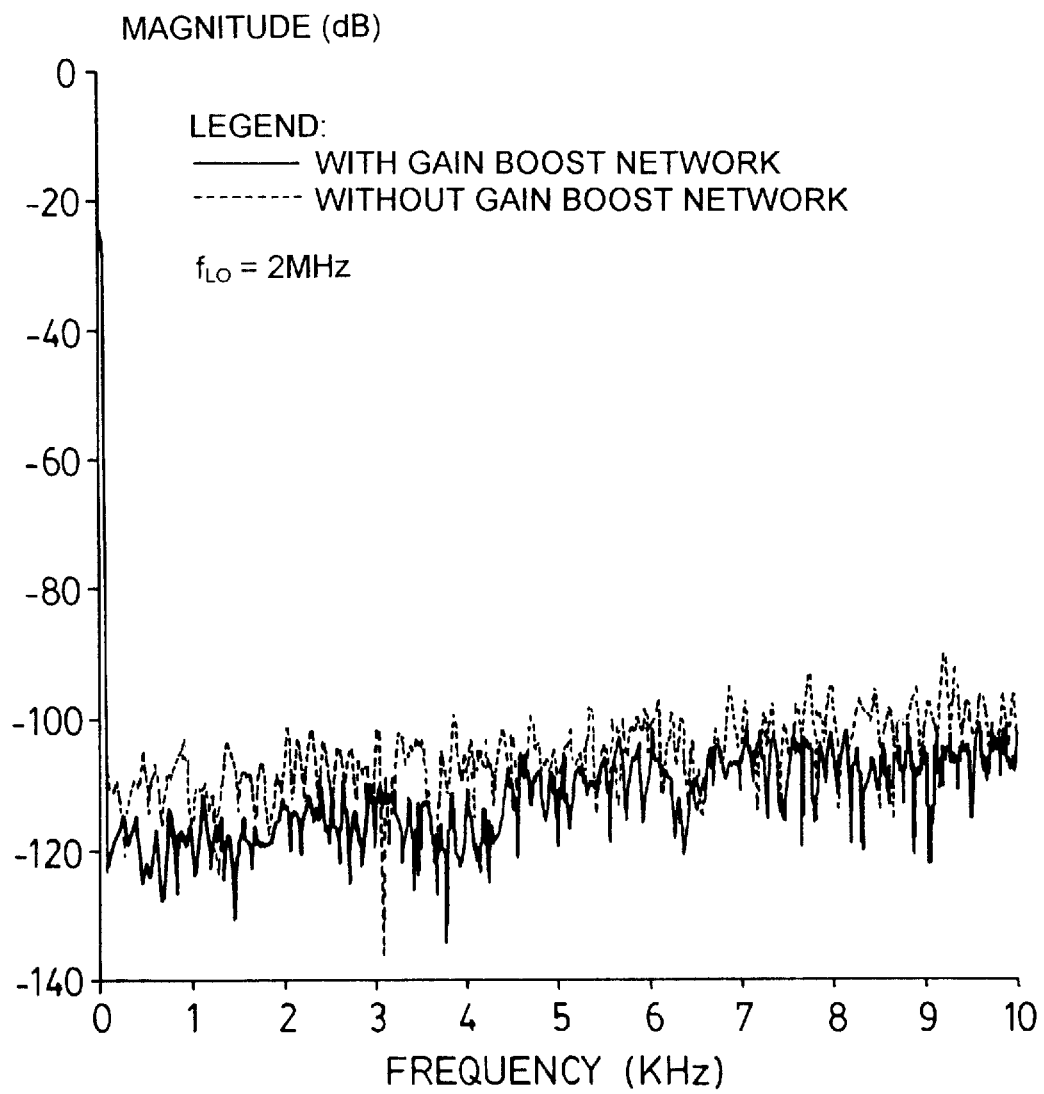
FIG. 5 shows the output spectrum of a $\Sigma\Delta$ modulator with and without a switched-capacitor gain-boost network in accordance with the present invention.

The switched-capacitor gain-boost networks 10 and 100 were implemented in 1.2 $\mu$m CMOS technology and incorporated into a $\Sigma\Delta$ modulator and tested. Preliminary testing showed that the switched-capacitor gain-boost network 10 with four sampling capacitors Cr provided for a dc gain of 3 at a sampling rate of 2 MHz. The introduction of the dc gain by the switched-capacitor gain-boost network 10 resulted in a significant SNR improvement. FIG. 5 shows the output spectrum of a $\Sigma\Delta$ modulator for cases with and without a gain-boost network. As can be seen, an 8 dB improvement in idle channel noise was achieved with the gain-boost network for a band width of 4 kHz.

The switched-capacitor gain-boost networks were computer simulated and a number of tests were performed on the simulated switched-capacitor gain-boost networks 10 and 100 to determine the effects of parasitics (particularly capacitive) on dc gain under various constraints such as speed, settling accuracy and integrated circuit (IC) technology. The results of these tests are described below and are shown in FIGS. 4a to 4i.

Figure 4A:
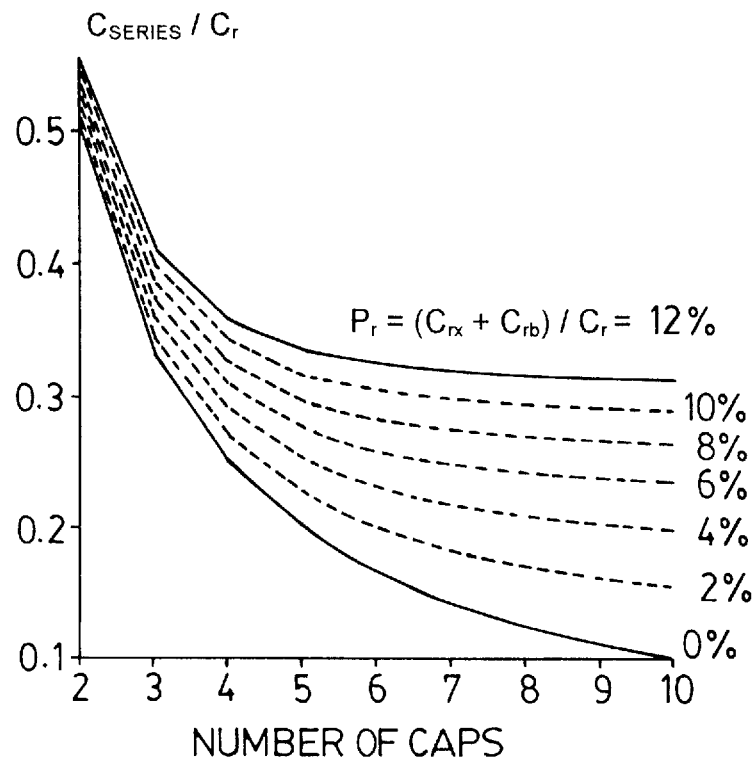
FIGS. 4a to 4i show performance characteristics of various embodiments of switched-capacitor gain-boost networks in accordance with the present invention.

Although the ideal transfer functions of the switched-capacitor gain-boost networks indicate that the dc gain is equal to N, in reality this is not the case due to a number of factors including parasitics. The exact dc gain of the switched-capacitor gain-boost networks can be solved based on charge conservation. This also allows the series capacitance of the switched-capacitor gain-boost networks during the integrating period to be derived which is important since the series capacitance determines both the dc gain and the pole position of the switched-capacitor gain-boost networks. FIG. 4a shows the equivalent series capacitance of the switched-capacitor gain-boost networks versus the number of sampling capacitors $Cr_x$ with parasitics as a variable.

Figure 4B:
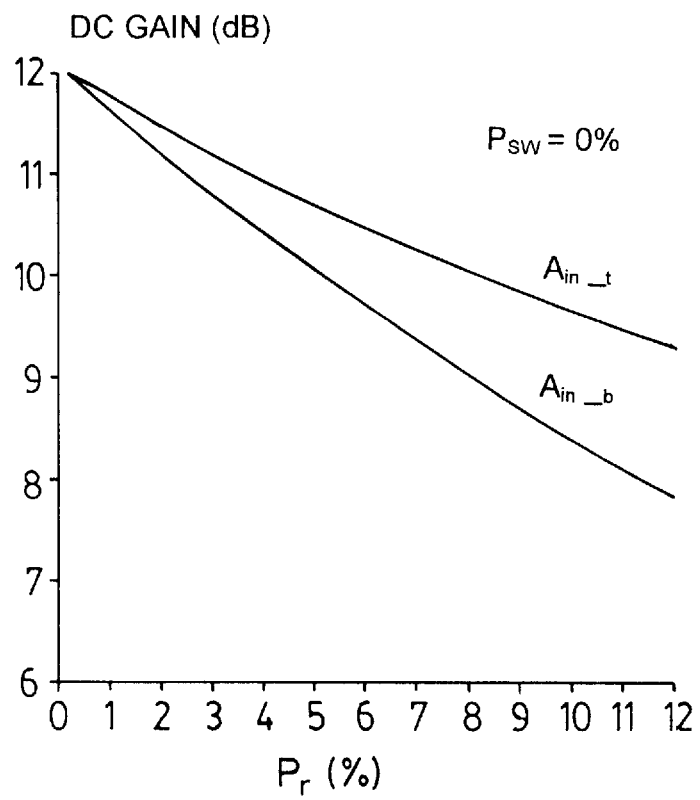

FIG. 4b shows the dc gain versus the total capacitive parasitics for the switched-capacitor gain-boost networks with N=4. With 10% parasitics, a dc gain $A_{in\_t}$ of 9.4 dB is achieved by switched-capacitor gain-boost network 100 and a dc gain $A_{in\_b}$ of 8.1 dB is achieved by switched-capacitor gain-boost network 10. As mentioned above, the poles of the switched-capacitor gain-boost networks are also dependent on the parasitics as well as the ratio of Ci and Cr where Cr is equal to the sampling capacitance of the switched-capacitor gain-boost networks. Since Ci/Cr can be controlled accurately with modern VLSI technology, parasitics determine the final pole position of the switched-capacitor gain-boost networks.

Figure 4C:
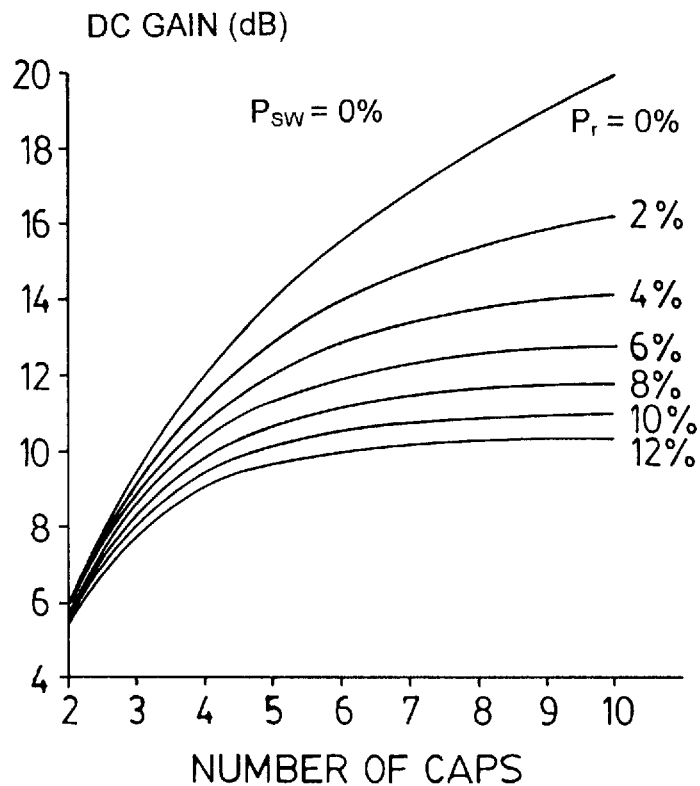
Figure 4D:
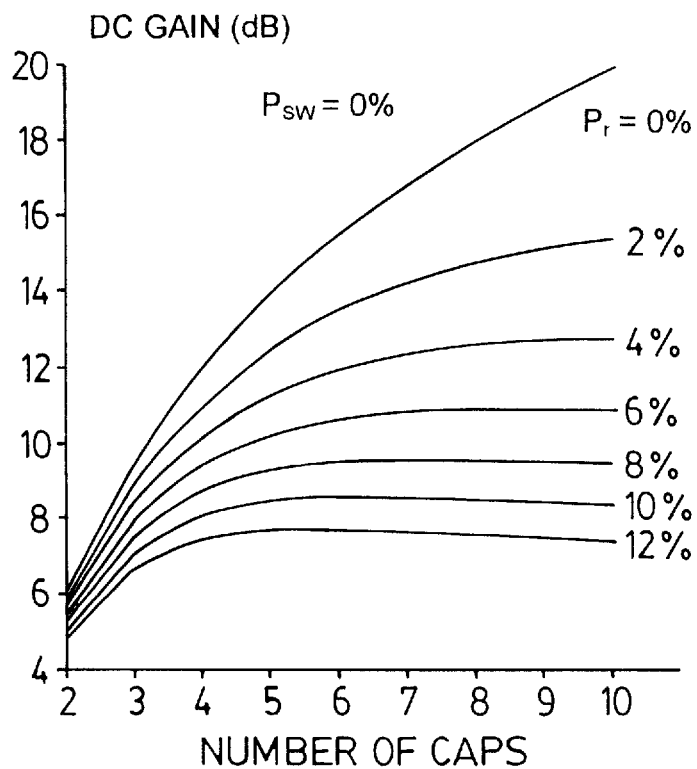
Figure 4E:
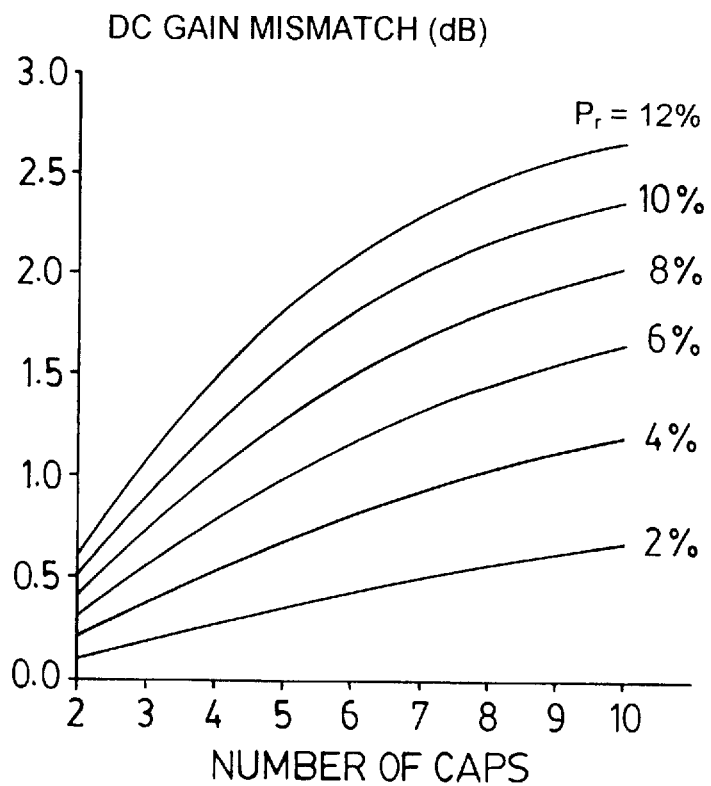

FIGS. 4c and 4d show the dc gain versus the number of sampling capacitors $Cr_x$ for the switched-capacitor gain-boost networks 100 and 10 respectively. It can be seen that with 10% parasitics, the dc gain $A_{in\_t}$ for the switched-capacitor gain-boost network 100 can only be 3 with four sampling capacitors $Cr_x$. FIG. 4e shows the ratio of the dc gains $A_{in\_t}/A_{in\_b}$ for the switched-capacitor gain-boost networks 100 and 10 respectively.

The relationship of sampling rate and settling accuracy n is given by:

$$\frac{0.4 \times T}{R_{sw}C_r} = n \quad (2)$$

where:

$T=1/f_{clk}$ is the clock period, 40% of which is assumed for settling;

$C_r$ is the unit sampling capacitor in the series connected bank; and $R_{SW}$ is the equivalent resistance of the CMOS switches 126.

Typically n=4 giving a settling error of less than 0.1%. To a first order approximation, the equivalent CMOS switch resistance, assuming the switches 126 operate in the triode region when conducting, is estimated to be:

$$R_{sw} = \frac{1}{2\mu_n \frac{W}{L} C_{ox}(V_{gs}-V_T) + 2\mu_p \frac{W}{L} C_{ox}(|V_{gs}-V_T|)} \quad (3)$$

assuming $V_T=V_{Tn}=V_{Tp}$. The parasitics contribution of each CMOS switch 126 with respect to the unit sampling capacitor $C_r$ is given by $$P_{SW} = \frac{C_{sw}}{C_r} = \frac{2 \times WLC_{ox}}{C_r} = \frac{nf_{clk}}{0.4} \frac{L^2}{(\mu_n + \mu_p)(|V_{gs} - V_T|)} \quad (4)$$

The above equation establishes a connection between dc gain and performance requirement as well as IC technology through the parasitics contributed by switches 126. It is known that capacitive parasitics at each node determine the dc gain of the switched-capacitor gain-boost networks and therefore, the above equation (4) provides a guideline for the design of the switched-capacitor gain-boost networks.

Figure 4F:
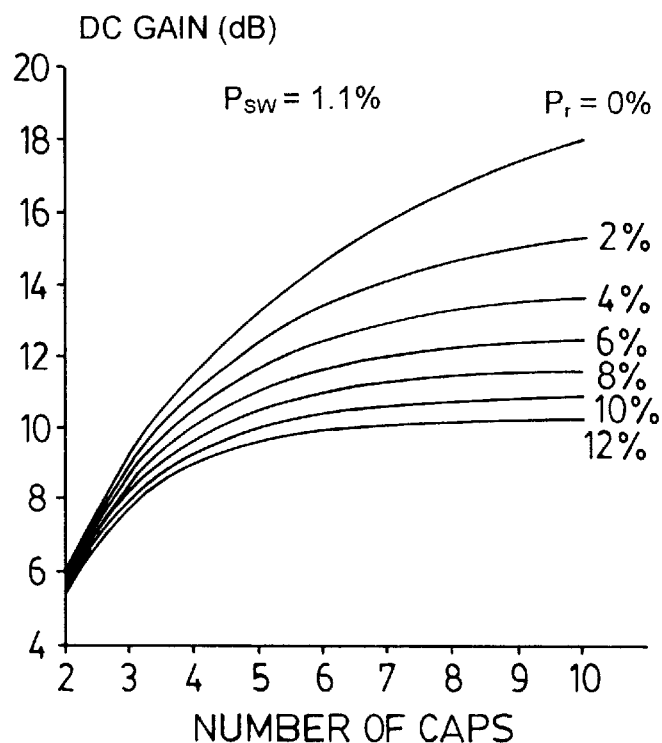
Figure 4G:
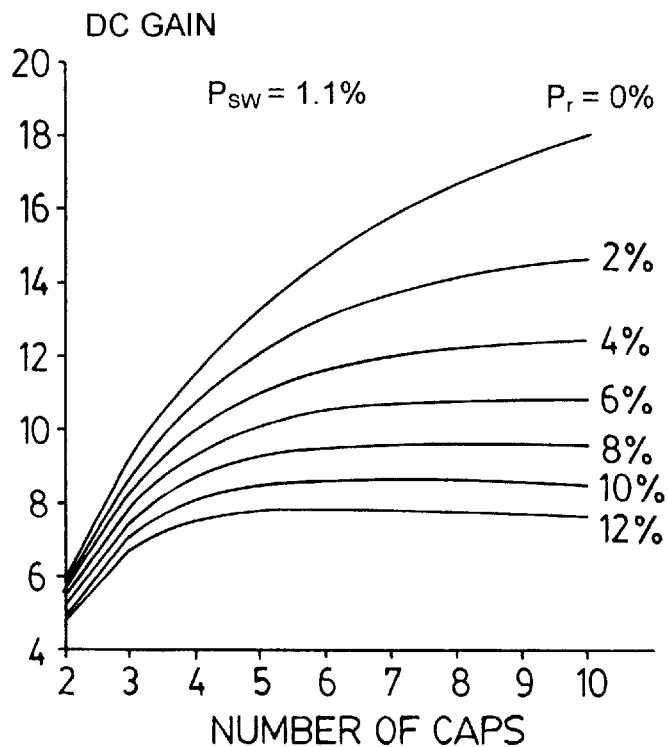

Assuming 1.2 μm CMOS technology with a threshold voltage of $V_T$=0.8V is used and assuming a 10 MHz sampling rate, to control the setting error within 0.1%(n=4), a sampling capacitor $Cr_x$ of 0.6 pF requires a CMOS switch of 2/1.2. This yields parasitic capacitance at about 3.3 fF. FIGS. 4f and 4g show the dc gains $A_{in\_t}$ and $A_{in\_b}$ of the switched-capacitor gain-boost networks versus the number of sampling capacitors used with a CMOS switch of 2/1.2. Compared to FIGS. 4b and 4c, it can be seen that gate capacitance reduces dc gain.

Figure 4H:
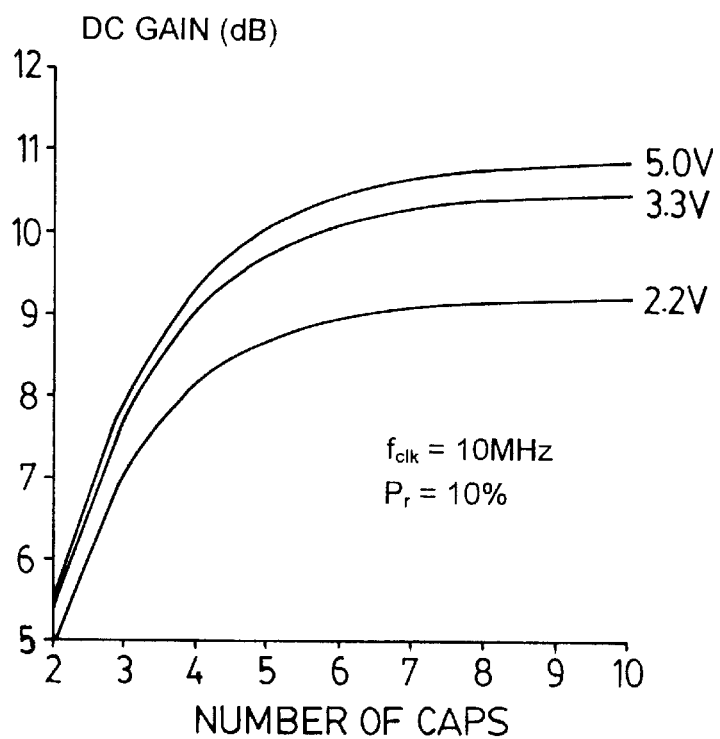

Based on the parasitics scaling relationship defined in equation (4), dc gain under different speed requirements, power supply voltages and different IC technologies for the switched-capacitor gain-boost networks of FIGS. 4f and 4g can be obtained. FIG. 4h shows the dc gain $A_{in\_t}$ of the switched-capacitor gain-boost network 100 versus the number of sampling capacitors with different power supplies as a variable and assuming total parasitics of 10% and a clock rate of 10 MHz. It can be seen that by reducing the power supply from 5V to 3.3V, little dc gain is sacrificed (0.4 dB at N=10). Even when power supply is reduced to 2.2V from 3.3V, the dc gain loss is only about 1.2 dB with N=10. A DC gain of 9.2 dB can still be achieved at a power supply of 2.2V.

Figure 4I:
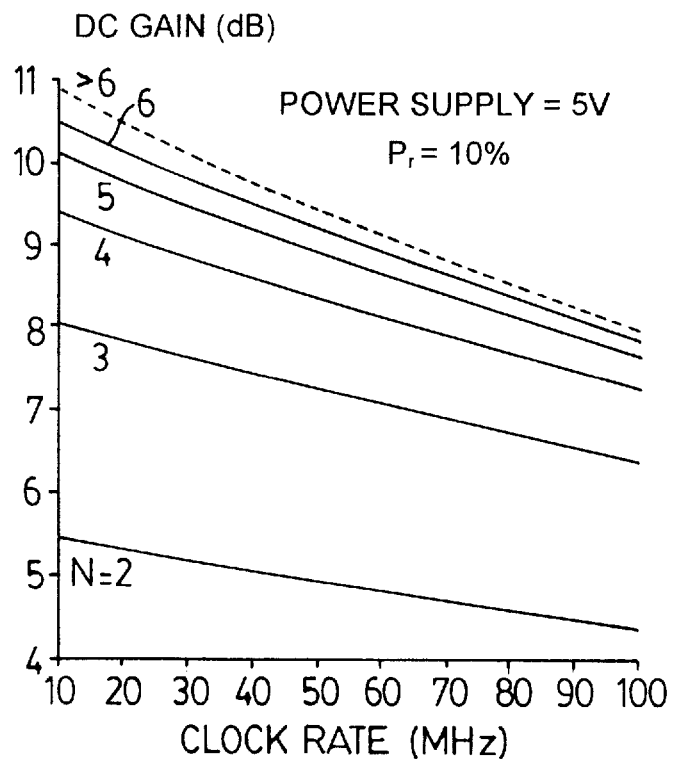

FIG. 4i shows the dc gain $A_{in\_t}$ of the switched-capacitor gain-boost network 100 versus the sampling rate assuming total parasitics of 10% and a 5V power supply. It can be seen that after scaling the switches so that the switched-capacitor gain-boost network can run at 100 MHz, there is only 2.6 dB dc gain loss at N=6 from 10 MHz. Therefore, even at moderate speeds such as 100 MHz, the switched-capacitor gain-boost network 100 can easily provide 7.8 dB dc gain at N=6. As one will appreciate, according to equation (4), if a more advanced IC technology is used which permits smaller feature sizes and/or lower threshold voltages $V_T$ and/or smaller parasitics, the switched-capacitor gain-boost networks could obtain larger dc gain at even lower power supplies or obtain higher speeds without sacrificing the settling accuracy.

Although specific embodiments of the present invention have been described, those of skill in the art will appreciate that variations and modifications may be made to the present invention without departing from the scope thereof as defined by the appended claims.

We claim:

1. A switched-capacitor gain-boost network comprising:
  a plurality of sampling charge storing devices having substantially similar charge storing characteristics, said plurality of sampling charge storing devices being connectable to an output node;
  an integrating charge storing device connected to said output node and connectable to said plurality of sampling charge storing devices in parallel; and
  switch means actuable during a sampling period to connect each of said sampling charge storing devices in parallel and between an analog signal input node and a first node and actuable during an integrating period to connect each of said sampling charge storing devices in series and between a low potential node and said output node wherein during said sampling period said switch means is actuated to inhibit injection charge errors from being applied to said integrating charge storage device by said sampling charge storage devices and wherein during said integrating period said switch means is actuated to inhibit voltage add-up from occurring across said sampling charge storage devices.

2. A switched-capacitor gain-boost network as defined in claim 1 wherein said switch means connects said sampling charge storing devices to said analog signal input node in a manner such that said switched-capacitor gain-boost network generates inverted output.

3. A switched-capacitor gain-boost network as defined in claim 1 wherein said switch means is also actuated during said integrating period to inhibit charge errors generated by said switch means from being applied to said integrating charge storage device.

4. A switched-capacitor gain-boost network as defined in claim 1 wherein said switch means connects said sampling charge storing devices to said analog signal input node in a manner such that said switched-capacitor gain-boost network generates non-inverted output.

5. A switched-capacitor gain-boost network as defined in claim 1 wherein said switch means is in the form of a plurality of first switches actuable during said sampling period and a plurality of second switches actuable during said integrating period, said first and second switches being responsive to clock signals to move between open and closed conditions.

6. A switched-capacitor gain-boost network as defined in claim 5 wherein said clock signals have sharp falling edges.

7. A switched-capacitor lowpass filter comprising:
  a bank of substantially identical sampling capacitors $Cr_1$ to $Cr_N$ connectable to an output node;
  an integrating capacitor connected between said output node and a low potential node, said integrating capacitor being connectable in parallel with said bank of sampling capacitors;
  a plurality of first switches actuable during a sampling period to connect the sampling capacitors of said bank in parallel and to connect said bank between an analog signal input node and a first node to charge each of said sampling capacitors; and
  a plurality of second switches actuable during an integrating period to connect the sampling capacitors of said bank in series and to connect said bank between a low potential node and said output node wherein after said sampling period, the first switch connecting said sampling capacitor $Cr_N$ to said analog signal input node is opened prior to opening the remaining first switches and wherein during said integrating period, the second switch connecting said sampling capacitor $Cr_N$ to said output node is closed prior to closing the remaining second switches.

8. A switched-capacitor lowpass filter as defined in claim 7 wherein said plurality of first switches connects said sampling capacitors to said analog signal input node in a manner such that said switched-capacitor lowpass filter generates inverted output.

9. A switched-capacitor lowpass filter as defined in claim 7 wherein said plurality of first switches connects said sampling capacitors to said analog signal input node in a manner such that said switched-capacitor lowpass filter generates non-inverted output.

10. A switched-capacitor lowpass filter as defined in claim 7 wherein said plurality of first and second switches are responsive to clock signals having sharp falling edges.

11. A method of providing dc gain to an analog input signal comprising the steps of:

(i) during a sampling period, connecting a plurality of substantially identical sampling capacitors in parallel and charging each of said sampling capacitors; and (ii) during an integrating period isolating said sampling capacitors from said analog input signal; connecting said sampling capacitors in series; and connecting the series-connected sampling capacitors to an output node and in parallel with an integrating capacitor wherein during said sampling period said sampling capacitors are isolated from said analog input signal in a manner to inhibit injection charge errors from being applied to said integrating capacitor by said sampling capacitors and wherein during said integrating period said sampling capacitors are connected in series and to said output node in a manner to inhibit voltage add-up from occurring across said sampling capacitors.

12. The method of claim 11 wherein after said sampling period the sampling capacitor connected directly to said output node is isolated from said analog input signal prior to the remaining sampling capacitors and wherein during said integrating period the sampling capacitor is connected directly to said output node before said sampling capacitors are connected in series.

13. An amplifierless switched-capacitor network comprising:

a plurality of generally identical sampling capacitors $Cr_1$ to $Cr_N$, one of said sampling capacitors $Cr_N$ being connectable to an output node by way of a first switch and to a low potential node by way of a second switch;

an integrating capacitor connected to said output node and to ground;

a plurality of third switches actuable during a sampling period to connect said sampling capacitors in parallel;

a plurality of fourth switches actuable during an integrating period to connect said sampling capacitors in series; and timing circuitry to apply clock signals to said first, second, third and fourth switches to actuate said switches between open and closed conditions wherein during said sampling period, said timing circuitry actuates said third switches to connect said sampling capacitors $Cr_1$ to $Cr_{N-1}$ to an analog signal input node and to a dc node and actuates said second switch to connect said sampling capacitor $Cr_N$ to said analog signal input node and to said low potential node; following said sampling period, said timing circuitry actuates said second switches to isolate sampling capacitor $Cr_N$ from said analog signal input node and said low potential node prior to actuating said second switches to isolate said sampling capacitors $Cr_1$ to $Cr_{N-1}$ from said analog signal input node and dc node; and during said integrating period, said timing circuitry actuates said first switch to connect said sampling capacitor $Cr_N$ to said output node prior to actuating said fourth switches to connect said sampling capacitors in series.

14. An amplifierless switched-capacitor network as defined in claim 13 where said clock signals have sharp falling edges.

* * * * *